United States Patent
Ackermann et al.

(10) Patent No.: US 11,277,095 B2
(45) Date of Patent: Mar. 15, 2022

(54) METHOD FOR PRODUCING A MULTICOLOUR OPTOELECTRONIC DEVICE COMPRISING MULTIPLE PHOTOACTIVE MATERIALS AND OPTOELECTRONIC DEVICE THUS PRODUCED

(71) Applicants: CENTRE NATIONAL DE LA RECHERCHE SCIENTIFIQUE, Paris (FR); UNIVERSITE D'AIX-MARSEILLE, Marseilles (FR)

(72) Inventors: Jörg Ackermann, Marseilles (FR); Sadok Ben Dkhil, Marseilles (FR); Olivier Margeat, Marseilles (FR); David Duché, Marseilles (FR); Ludovic Escoubas, Marseilles (FR); Jean-Jacques Simon, Peypin (FR); Christine Videlot-Ackermann, Marseilles (FR)

(73) Assignees: CENTRE NATIONAL DE LA RECHERCHE SCIENTIFIQUE, Paris (FR); UNIVERSITÉ D'AIX-MARSEILLE, Marseilles (FR)

( * ) Notice: Subject to any disclaimer, the term of this patent is extended or adjusted under 35 U.S.C. 154(b) by 95 days.

(21) Appl. No.: 16/488,317

(22) PCT Filed: Feb. 23, 2018

(86) PCT No.: PCT/EP2018/054474
§ 371 (c)(1),
(2) Date: Aug. 23, 2019

(87) PCT Pub. No.: WO2018/154039
PCT Pub. Date: Aug. 30, 2018

(65) Prior Publication Data
US 2019/0393836 A1    Dec. 26, 2019

(30) Foreign Application Priority Data

Feb. 24, 2017 (EP) .................... 17157916

(51) Int. Cl.
*H01L 31/0445* (2014.01)
*H02S 99/00* (2014.01)
(Continued)

(52) U.S. Cl.
CPC .......... *H02S 99/00* (2013.01); *H01L 51/0003* (2013.01); *H01L 51/0026* (2013.01);
(Continued)

(58) Field of Classification Search
CPC .... H01L 27/142; H01L 31/04; H01L 31/0445
See application file for complete search history.

(56) References Cited

U.S. PATENT DOCUMENTS 7,572,396 B2   8/2009   Gaudiana et al.
8,168,087 B2   5/2012   Gaudiana et al.
(Continued)

FOREIGN PATENT DOCUMENTS

EP    1672653 A2    6/2006
EP    2999020 A1    3/2016
(Continued)

OTHER PUBLICATIONS

International Search Report and Written Opinion, dated Jun. 5, 2018, from corresponding PCT application No. PCT/EP2018/054474.
(Continued)

*Primary Examiner* — Jae Lee
(74) *Attorney, Agent, or Firm* — Nixon & Vanderhye

(57) ABSTRACT

A method for producing a multicoloured optoelectronic device is provided as well as a device produced with that method. An electrically conducting substrate including a
(Continued)

first and second portion adjacent to the first portion is obtained. Then a first photoactive material having optical properties in a first frequency range is deposited on the first portion and a second photoactive material differing from the first photoactive material having optical properties in a second frequency range is deposited on the second portion, the first photoactive material contacting the second photoactive material, forming a photoactive layer of the multicoloured optoelectronic device.

14 Claims, 8 Drawing Sheets

(51) Int. Cl.
    *H01L 51/00* (2006.01)
    *H01L 51/42* (2006.01)
(52) U.S. Cl.
    CPC ...... *H01L 51/4253* (2013.01); *H01L 51/0035* (2013.01); *H01L 51/0036* (2013.01); *H01L 51/0037* (2013.01); *H01L 51/0043* (2013.01); *H01L 51/0047* (2013.01)

(56) References Cited

U.S. PATENT DOCUMENTS

| | | |
|---|---|---|
| 9,155,157 B2 | 10/2015 | Loebl et al. |
| 9,929,366 B2 | 3/2018 | Noda |
| 2016/0141541 A1* | 5/2016 | Noda ............... H01L 27/3206 257/40 |
| 2017/0108751 A1* | 4/2017 | Yoon ............... G02F 1/133528 |

FOREIGN PATENT DOCUMENTS

| | | | |
|---|---|---|---|
| WO | 2008/020396 A1 | 2/2008 | |
| WO | WO-2014185529 A1 * | 11/2014 | ......... H01L 27/3206 |

OTHER PUBLICATIONS

Yongbo et al., "Arising applications of ferroelectric materials in photovoltaic devices", Journal of Materials Chemistry A, 2014, vol. 2, No. 17, pp. 6027-6041.

European Search Report, dated Aug. 28, 2017, from corresponding EP application No. 17157916.

* cited by examiner

METHOD FOR PRODUCING A MULTICOLOUR OPTOELECTRONIC DEVICE COMPRISING MULTIPLE PHOTOACTIVE MATERIALS AND OPTOELECTRONIC DEVICE THUS PRODUCED

FIELD OF THE INVENTION

The invention pertains to the field of optoelectronic devices such as solar cells or light emitting diodes having coloured photoactive layers. In particular, the coloured photoactive layers may be based on organic, inorganic or hybrid organic-inorganic materials and serve to improve the external aspect of photovoltaic panels or light emitting devices enabling these devices to better blend into their environment. Coloured photoactive layers can also be used in novel applications to harvest residual light energy for example in windows or screens or provide discreet sources of light that are less noticeable than conventional optoelectronic devices.

BACKGROUND OF THE INVENTION

Optoelectronic devices are used in multiple applications to either absorb or emit light. Light emitting diodes are examples of efficient and cheap light sources using a photoactive layer to convert electrical energy into photons. Solar cells are examples of light absorbing optoelectronic devices that use a photoactive layer to convert photons into charge carriers that are collected as electrical current.

Recent developments in optoelectronic devices and in particular solar cells aim to reduce their fabrication costs and enable their use in a broader range of applications.

Traditional solar cells appear in the form of dark, blue panels. These devices are very noticeable and do not blend easily into an urban environment.

Coloured solar cells and semi-transparent solar cells have been developed to improve blending of solar cells into their environment and expand their possible applications. Coloured solar cells can be designed with patterns or colours to better integrate into their environment and be used over a larger range of surfaces, especially in urban areas. Semi-transparent solar cells can further be used to harvest residual light emitted by screens or passing through windows, while still being discreet and barely noticeable.

Coloured solar cells can in particular be fabricated using organic materials in the photoactive layer. These organic materials typically appear in the form of a polymer and small donor molecules mixed with acceptor molecules (usually fullerenes) in a bulk heterojunction. This organic material is generally called a "blend". Other architectures are also available to produce coloured solar cells relying on inorganic or hybrid organic-inorganic materials.

When light is cast on an organic solar cell, an electron-hole pair called an exciton is generated in the photoactive layer. The holes and electrons are channeled to separate layers on top of and below the photoactive layer to create an electrical current.

A typical architecture for an organic solar cell comprises a glass layer, an indium tin oxide layer (upper transparent electrode), a hole extraction layer (typically Pedot:PSS or poly(3,4-ethylenedioxythiophene) polystyrene sulfonate), the photoactive layer, an electron extraction layer (typically ZnO) and an electrically conducting substrate. The electrically conducting substrate can be a semi-transparent material or a metal such as aluminum.

In an inverted device structure, it is possible to swap the respective positions of the electron extraction layer (ZnO) and the hole-extraction layer (Pedot:PSS) in the solar cell.

Organic solar cells can convey different colours to a photovoltaic panel due to the specific absorption bands in the visible spectrum of organic semiconductors used in the photoactive layer. As a result, one possibility to conceive organic solar cells having a desired colour is to select an appropriate composition for the blend, or add additives such as metals in relevant proportions to change the absorption bands of the blend in the visible spectrum and thus the colour of the device. Coloured solar cells can also be produced using inorganic materials by using for example optical filters or reflecting coating.

Even though the selection of an appropriate composition for the material does enable the production of a wider range of colours for an organic solar cell, the inclusion of additives and need to produce specific compounds for each colour renders the manufacturing of these cells more complex.

A different approach to expand the spectrum of colours available for an organic solar cell consists in changing the thickness of the photoactive layer and/or the thicknesses of the hole and electron extraction layers. It has indeed been noticed that layer thicknesses influence not only the light absorption efficiency of cells but also their colour. To change the thickness of the photoactive layer, it is possible to change the concentration of the polymer in the blend or the viscosity of the solution in which the blend is prepared before being deposited.

All of the above methods to fabricate a colour optoelectronic device require the production of a multitude of solar cells, in particular one solar cell for each colour present on a photovoltaic panel (or light emitting diode array). Due to the differences in the electrical properties of each type of photoactive layer, the electrical connections of such cells on a panel requires complex designs so that solar cells having the same colour are connected together but not to cells having different colours. This renders the fabrication of colour patterns on a photovoltaic panel or light emitting diode array complicated.

In view of the above drawbacks associated with the fabrication and design of colour optoelectronic devices, a simple method for producing colour optoelectronic devices is sought.

SUMMARY OF THE INVENTION

To overcome the above-listed deficiencies of the prior art, the invention provides a method for producing a multicoloured optoelectronic device comprising:
  obtaining an electrically conducting substrate comprising at least a first portion and a second portion adjacent to the first portion,
  depositing a first photoactive material having optical properties in a first frequency range on the first portion,
  wherein the method further comprises:
  depositing a second photoactive material differing from the first photoactive material and having optical properties in a second frequency range on the second portion, the first photoactive material contacting the second photoactive material, the first photoactive material and second photoactive material forming a photoactive layer of the multicoloured optoelectronic device.

By arranging at least two different photoactive materials on a same electrically conducting substrate, the invention enables the production of optoelectronic devices such as for example solar cells or light emitting diodes that have different colours on a same substrate. Prior art methods only provide means to change the colour of a device by keeping a homogeneous colour across the device. Prior art methods require complex arrangements and shape designs to produce panels or arrays having multiple colours or displaying a pattern. The method of the invention overcomes this requirement and enables the production of a plurality of colours that can be arranged over one single substrate of one device with any pattern.

The method of the invention thereby renders the fabrication of colour patterns simple, by overcoming the need to produce devices (such as solar cells) having complex shapes or specific electrical contacts for each type of colour present on a panel or array. Indeed, by ensuring that each photoactive material on the electrically conducting substrate is in contact with another photoactive material, the resulting optoelectronic device successfully channels current produced by each photoactive material in the solar cell and can be connected to other neighboring cells of a module or panel regardless of the colour or colours of their photoactive layers.

The term "optical properties in a frequency range" used above refers to the spectral absorption/emission bands of a photoactive material, which is a feature contributing to the colour of the photoactive material. It is assumed that the "frequency range" comprises a portion of the visible spectrum along at least one frequency, which gives the optoelectronic device a noticeable colour in the visible spectrum.

Although the invention teaches the use of two different photoactive materials deposited on a same substrate, theses photoactive materials can differ by their thickness (that is to say that they may have a similar composition, but lead to different colours because of specific optoelectronic properties resulting from their thickness). It is also possible that the two photoactive materials have the same thickness but very different compositions, leading to two different colours as well.

It is to be noted that the "electrically conducting substrate" may refer to the metal or semi-transparent layer used as an electrode of the optoelectronic device (for example, an aluminum layer), or can also refer to one of the extraction layers that may be found on top of this electrode layer (hole or electron extraction layer).

The term "photoactive material" can revert both to organic compounds (polymer blends) or inorganic compounds, having any type of structure.

According to an embodiment, the method may further comprise:
    associating the first photoactive material with the second photoactive material in an area where the first portion contacts the second portion to form a mixed photoactive material in said area.

The presence of a mixed photoactive material in an area at the contact between both photoactive materials reduces the risk of electrical shunts or voids appearing in the photoactive layer. The mixed photoactive material in that area ensures better electrical contacts between both photoactive materials. In the case of organic solar cells, two photoactive blends can mix in liquid form prior to being dried.

To improve the quality of the mixing of both photoactive materials and avoid the creation of sharp interfaces, it is further possible to heat each photoactive material on a plate before depositing them on the electrically conducting substrate. This may also speed up the mixing of both materials in the area where they meet on the electrically conducting substrate.

According to an embodiment, the method may further comprise:
    determining respective sizes of the first portion and of the second portion so that a ratio between an amount of first photoactive material and an amount of second photoactive material gives rise to a photoactive layer having a predetermined value for a photo-electrical parameter in a range between a value of said photo-electrical parameter in the first photoactive material and a value of said photo-electrical parameter in the second photoactive material.

It has been observed that the overall optoelectronic properties of the device result from a combination of the optoelectronic properties of each photoactive material present on the electrically conducting substrate. It is thus possible to design an optoelectronic device having original photo-electrical properties situated in a range between those of each of the photoactive materials used. The amount of each photoactive material used on an optoelectronic device can be controlled by controlling the size of each corresponding portion on the electrically conducting substrate.

According to an embodiment, the photo-electrical parameter of the photoactive layer may be chosen from among: open voltage, short-circuit current density, light-electricity conversion efficiency, electricity-light conversion efficiency.

According to an embodiment, the first photoactive material and the second photoactive material may be deposited using a technique chosen from among: drop casting, slot die coating, doctor blading, spin coating, ink jet printing, screen printing, gravure and flexography, spray coating.

According to an embodiment, the method may further comprise:
    depositing the first photoactive material on the first portion to form a first homogeneous layer,
    depositing the second photoactive material on the second portion to from a second homogenous layer in contact with the first homogeneous layer,
    drying the first homogenous layer and the second homogenous layer.

According to an alternative embodiment, the method may further comprise:
    depositing the first photoactive material on the first portion to form a first homogeneous layer,
    drying the first homogenous layer,
    depositing the second photoactive material on the second portion to from a second homogenous layer in contact with the first homogeneous layer,
    drying the second homogenous layer.

It is advantageous to deposit the photoactive materials from opposite sides of the electrically conducting substrate so that they can migrate across their respective portions of the electrically conducting substrate until they reach the area in which they both mix to form the mixed photoactive layer. This method is particularly suitable for organic solar cells, for the fabrication of which polymer blends are used. Polymer blends can mix in liquid form prior to being dried.

If the first photoactive blend and the second photoactive blend are prepared so as to have different thicknesses on the electrically conducting substrate, it is advantageous to dry each photoactive blend separately and to deposit them sequentially on the substrate.

According to an embodiment, the method may further comprise:
    selecting the composition and/or viscosity of the first photoactive material and the second photoactive material to obtain a desired thickness and desired optical properties for the photoactive layer.

The method of the invention can be combined with other techniques used to adapt the colour of a photoactive layer, such as controlling its thickness and composition.

The invention is also directed to a multicoloured optoelectronic device comprising:
- an electrically conducting substrate comprising at least a first portion and a second portion adjacent to the first portion,
- a photoactive layer on the electrically conducting substrate,
- wherein the photoactive layer comprises a first photoactive material having optical properties in a first frequency range on the first portion and a second photoactive material differing from the first photoactive material and having optical properties in a second frequency range on the second portion, the first photoactive material contacting the second photoactive material.

According to an embodiment, the photoactive layer may further comprise an area above a contact between the first portion and the second portion comprising a photoactive material resulting from a mixture of the first photoactive material with the second photoactive material.

According to an embodiment, the first photoactive material at least partially overlaps the second photoactive material.

Such an overlap can be used to create a third colour, especially at the corresponding to a junction of the first portion with the second portion.

According to an embodiment, the first and the second photoactive materials may be chosen from among: P3HT:PCBM, PTB7:PCBM, PTB7-Th:PCBM, PBDB-T:PCBM, PBDB-T:ITIC.

These materials cover a significant part of the visible spectrum, especially when their thicknesses or exact composition is adjusted to meet specific needs.

According to an embodiment, the photoactive layer may further comprise at least one ferroelectric material.

The addition of a ferroelectric material increases the open voltage of the optoelectronic device, thereby improving its electrical properties.

According to an embodiment, the multicoloured optoelectronic device may be chosen from among: a solar cell, a photovoltaic panel, a light emitting diode, a light emitting diode array, a perovskite-based solar cell, a perovskite-based light emitting diode, a quantum dot based hybrid solar cell, an organic light emitting diode.

The invention can be used on light absorbing devices such as photovoltaic cells, or light emitting devices such as light emitting diodes, regardless of their exact structure.

According to an embodiment, the multicoloured optoelectronic device is a photovoltaic panel comprising cells whose shape is independent from an arrangement of the first and second photoactive materials on the electrically conducting substrate.

The design of panels having any shape, regardless of the colours present on each solar cell, facilitates the fabrication of the panels and cells as well as the fabrication of their electrical contacts.

According to an embodiment, the optoelectronic device may comprise a transparent electrically conducting substrate.

Transparent electrically conducting substrates enable the optoelectronic device to be used in a wider range of applications such as windows or screens to absorb residual light or emit light from a transparent support surface.

BRIEF DESCRIPTION OF THE DRAWINGS

The method of the invention will be better understood by reading the detailed description of exemplary embodiments presented below. These embodiments are illustrative and by no means limitative. They are provided with the appended figures and drawings on which.

For the sake of clarity, the dimensions of features represented on these figures and drawings may not necessarily correspond to the real-size proportions of the corresponding elements Like reference numerals on the figures and drawings correspond to similar elements or items.

DETAILED DESCRIPTION

The invention provides a method for fabricating optoelectronic devices such as solar cells, photovoltaic panels, light emitting diodes, or light emitting diode arrays that can be based on any type of architecture. For example the optoelectronic devices can be organic solar cells, perovskite-based solar cells, perovskite-based light emitting diodes, quantum dot based hybrid solar cells, organic light emitting diodes. The method overcomes the need to produce optoelectronic devices that have a homogenous photoactive layer, that is to say photoactive layers of only one colour each. The invention provides instead an optoelectronic device having a multicolour photoactive layer and a method for fabricating such a device.

Existing methods for fabricating optoelectronic devices, and in particular solar cells, rely on the selection of a specific composition for the "photoactive material" used to make the photoactive layer, and adapt the thickness of the blend.

In the following description, examples will be provided in connection with organic solar cells. However, the invention can be implemented using other types of solar cells or light emitting structures that do not necessarily use organic compounds in the "photoactive material".

In organic solar cells, the "photoactive material" is a blend, made of a polymer as well as donor and acceptor molecules to create an interpenetrated bulk heterojunction which is the equivalent of p-n junction.

Figure 1A:
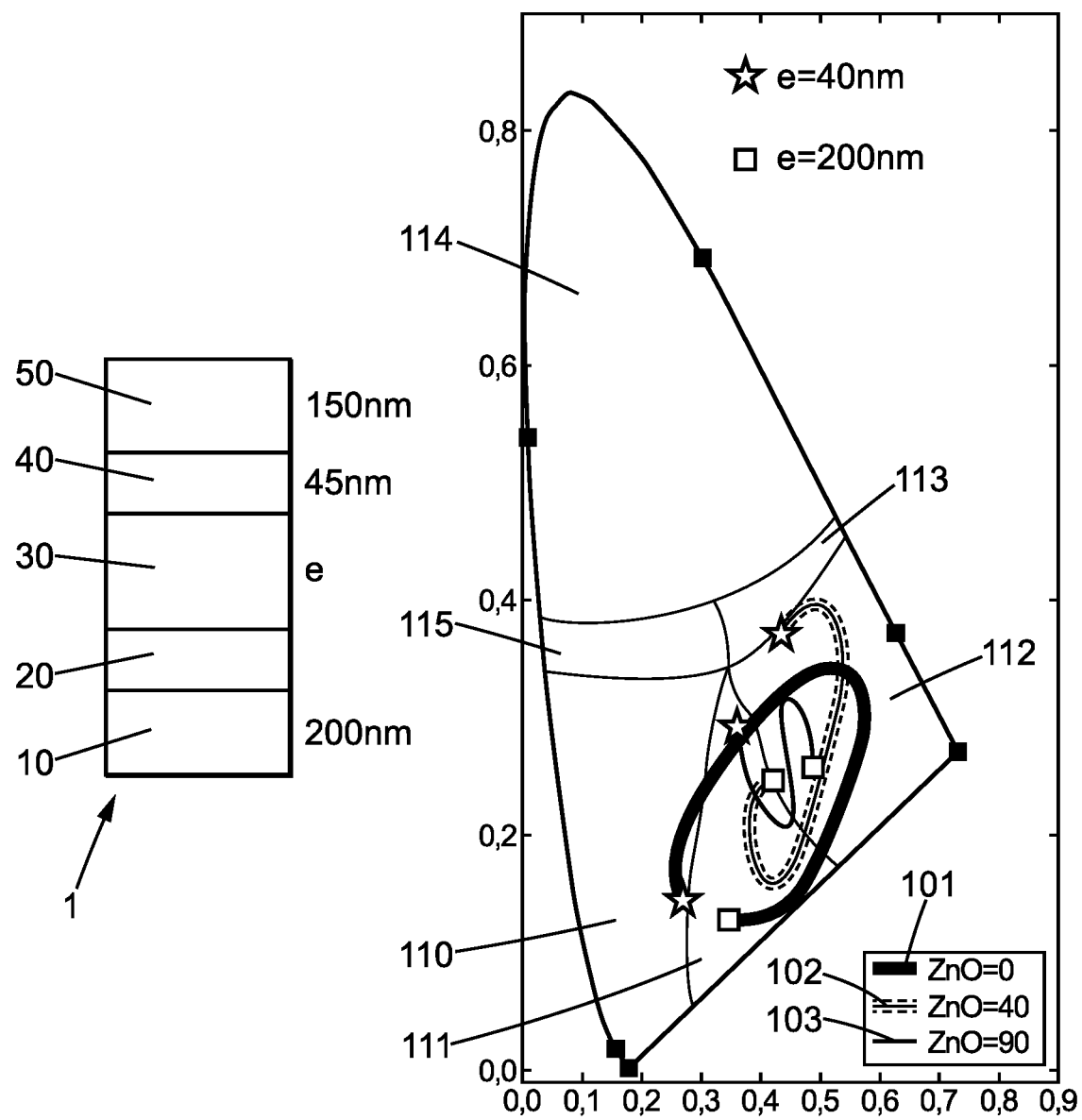
FIGS. 1a and 1b are diagrams representing the colours that can be obtained for an organic solar cell by varying the thickness of the photoactive layer and the thickness, respectively, of the electron (a) or hole (b) extraction layers, when the material (blend) used for the photoactive layer is based on P3HT:PCBM.
Figure 1B:
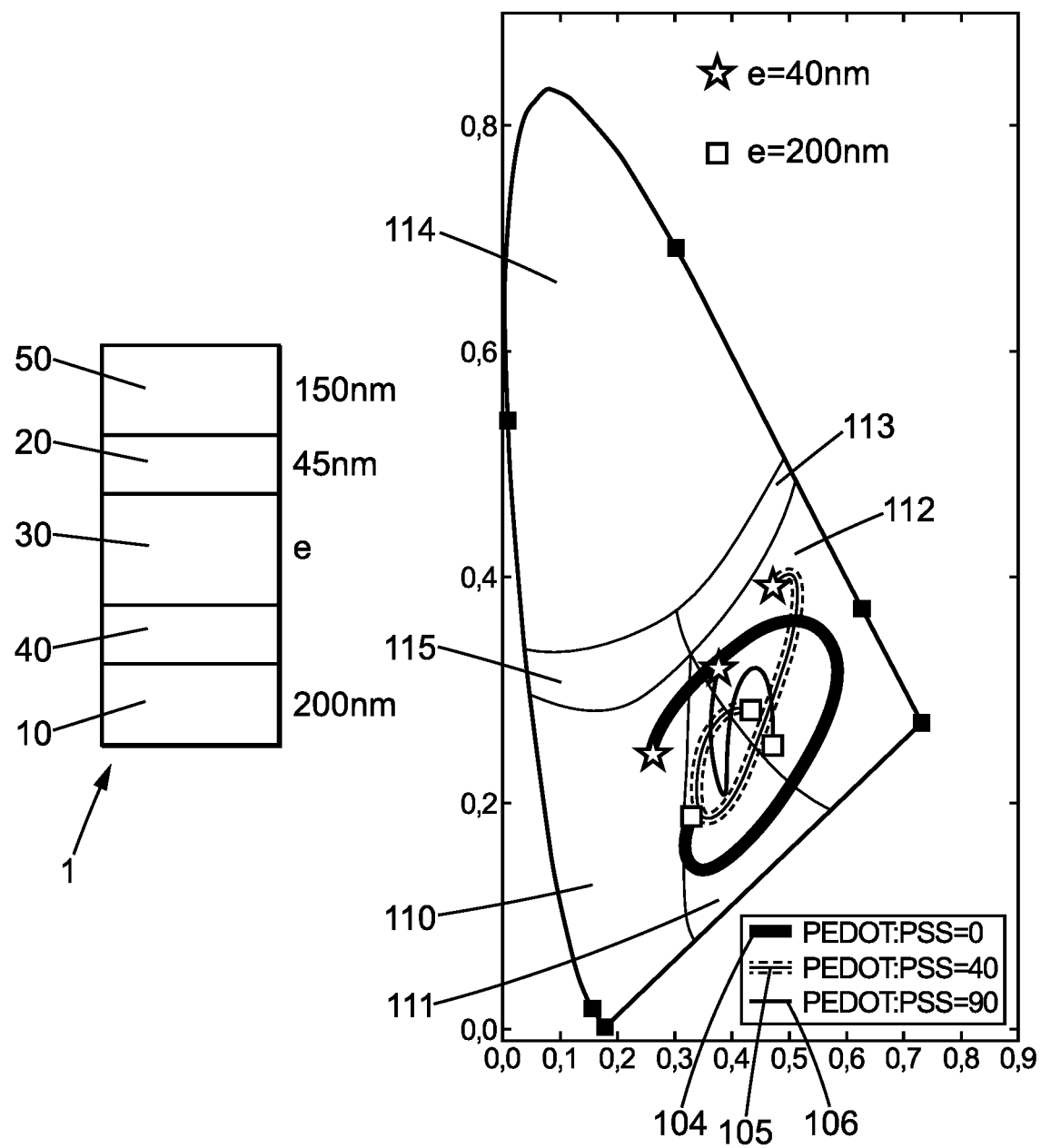
Figure 2A:
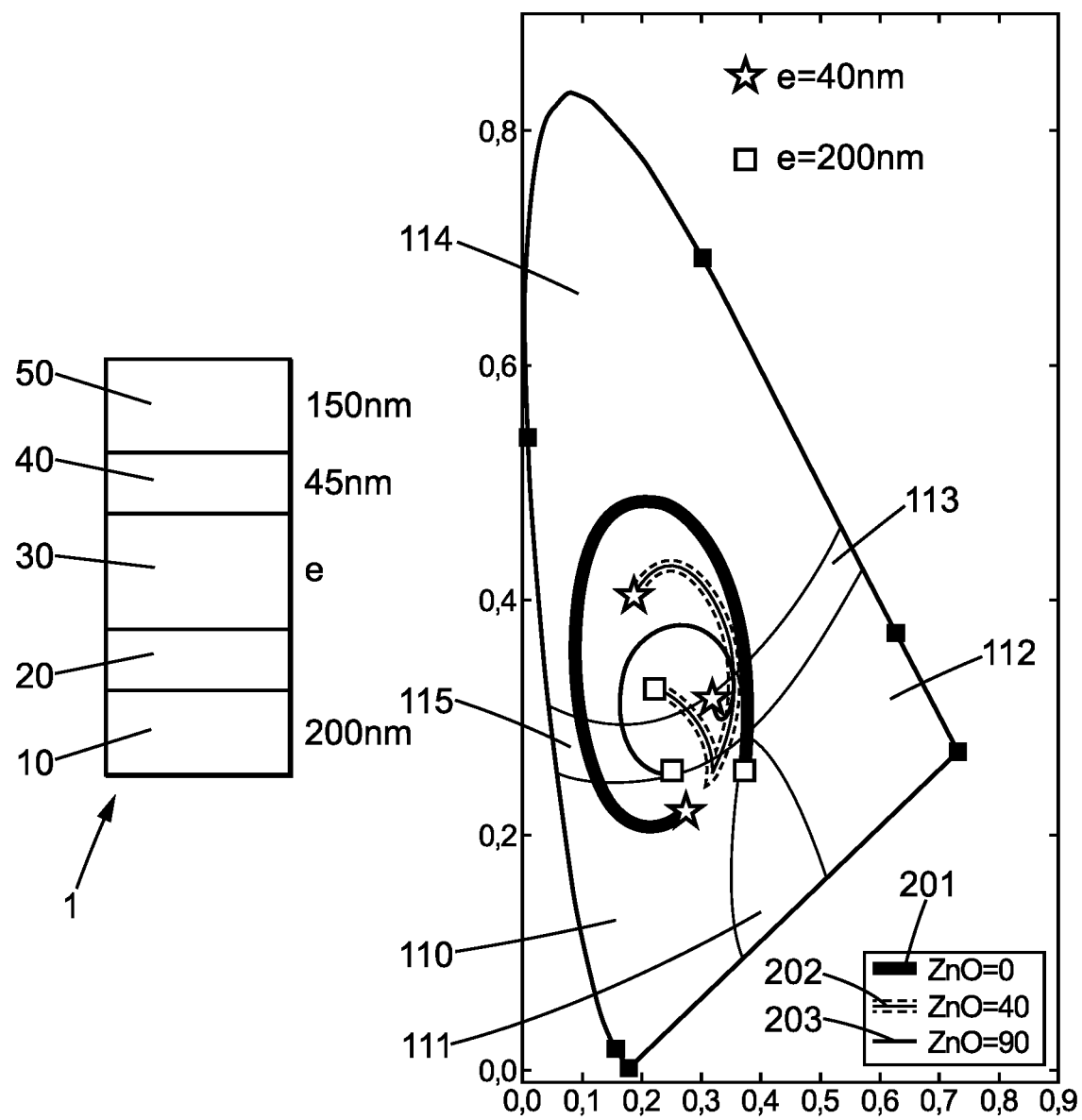
FIGS. 2a and 2b are diagrams representing the colours that can be obtained for an organic solar cell by varying the thickness of the photoactive layer and the thickness, respectively, of the electron (a) or hole (b) extraction layers, when the material (blend) used for the photoactive layer is based on PTB7:PCBM.
Figure 2B:
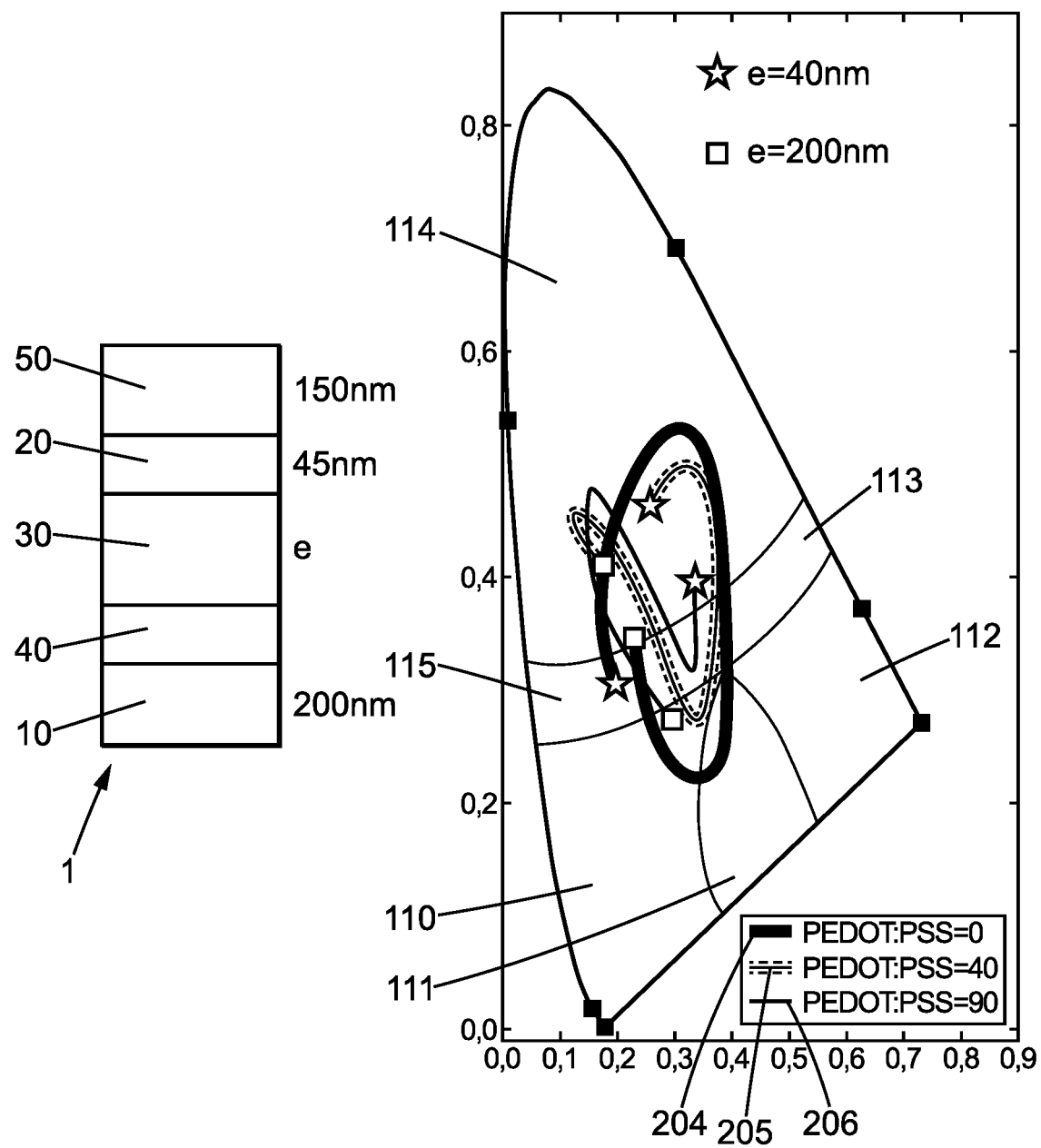

FIGS. 1a, 1b, 2a, 2b schematically illustrate the colour range that can be obtained by selecting a specific type of photoactive blend (P3HT:PCBM which stands for a blend of poly(3-hexylthiophene) (P3HT) and phenyl-C61-butyric acid methyl ester (PCBM) in the case of FIGS. 1a and 1b, and PTB7:PCBM which stands for a blend of poly[[4,8-bis [(2-ethylhexyl)oxy]benzo[1,2-b:4,5-b]dithiophene-2,6-diyl] [3-fluoro-2-[(2-ethylhexyl) carbonyl] thieno[3,4-b]thiophenediyl]] and phenyl-C61-butyric acid methyl ester (PCBM) in the case of FIGS. 2a and 2b), and by changing the thickness of the photoactive blend and one of the extraction layers (electron extraction ZnO layer in the case of FIGS. 1a and 2a, and hole extraction Pedot:PSS in the case of FIGS. 1b and 2b).

FIGS. 1a and 2a provide examples of normal device structures in which the optoelectronic device 1 (solar cell) comprises an electrically conducting substrate 10, an electron extraction layer 20, a photoactive layer 30, a hole extraction layer 40 and an upper conducting layer typically made of indium tin oxide (ITO). The graph of FIGS. 1a and 2a shows on a colour palette the possible colours that can be obtained using three different thicknesses for the ZnO electron extractor layer 20, namely in the absence of such a layer (thick line 101), with a 40 nm thick ZnO layer (dotted line 102) or with a 90 nm thick ZnO layer (straight line 103). The colours of the palette comprise dark blue 110, purple 111, red 112, yellow 113, green 114, light blue 115 areas.

FIG. 1a shows that a blend based on P3HT:PCBM cannot be used to obtain yellow, green or light blue solar cells by changing the thickness of the blend between 40 nm and 200 nm. Lines joining squares to stars represent all the colours available for a given thickness of ZnO when the thickness of the photoactive blend is changed from 40 nm (at the location of the palette marked with a star) to 200 nm (at the location of the palette marked with a square). A similar conclusion can be drawn from FIG. 1b, which displays the same information in the case of an inverted device structure in which the hole extraction layer 40 and electron extraction layer 20 are swapped. FIG. 1b displays the possible colours obtained when the thickness of the photoactive layer is changed from 40 nm to 200 nm, with no hole extraction layer (thick line 104), with a hole extraction layer having a thickness of 40 nm (dotted line 105) and with a hole extraction layer having a thickness of 90 nm (straight line 106).

FIG. 2a displays the possible colours obtained when the thickness of the photoactive layer is changed from 40 nm to 200 nm, with no electron extraction layer (thick line 201), with an electron extraction layer having a thickness of 40 nm (dotted line 202) and with an electron extraction layer having a thickness of 90 nm (straight line 203). It can be seen on FIG. 2a that a PTB7:PCBM polymer blend is not suitable to fabricate yellow, red or purple solar cells. A similar conclusion can be drawn from the colour palette of FIG. 2b, which displays the same information in the case of an inverted device structure. FIG. 2b displays the possible colours obtained when the thickness of the photoactive layer is changed from 40 nm to 200 nm, with no hole extraction layer (thick line 204), with a hole extraction layer having a thickness of 40 nm (dotted line 205) and with a hole extraction layer having a thickness of 90 nm (straight line 206).

FIGS. 1a, 1b, 2a, 2b teach that using only one photoactive blend composition generally does not enable to cover a wide spectrum of the visible spectrum just by changing the thickness of the blend or the thickness of interface layers.

The invention provides a method for depositing two different photoactive materials on a same electrically conducting substrate.

Figure 3A:
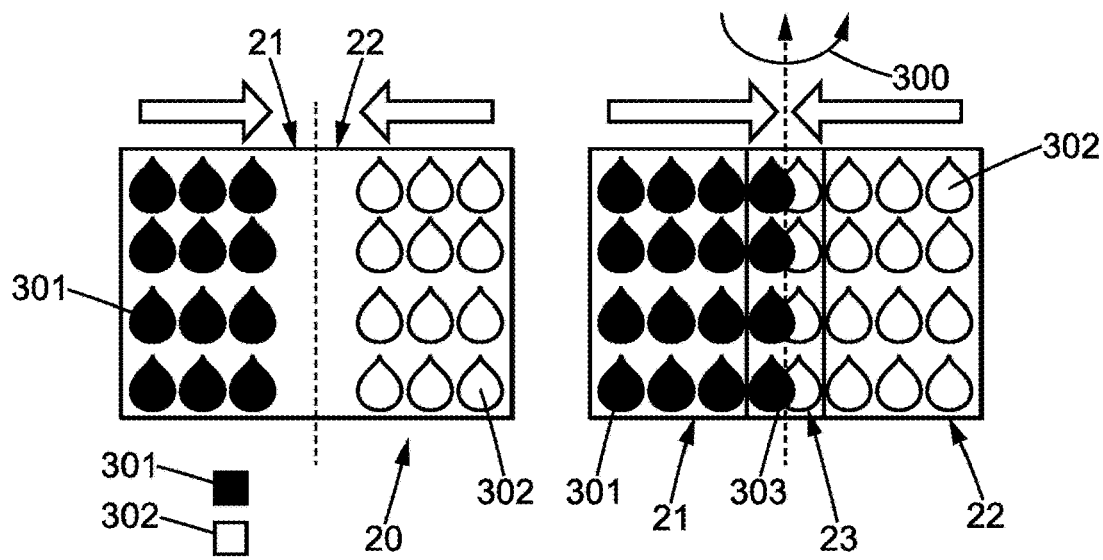
FIG. 3a is a schematic representation of a method for depositing two photoactive blends on an electrically conducting substrate according to a first embodiment.
Figure 3B:
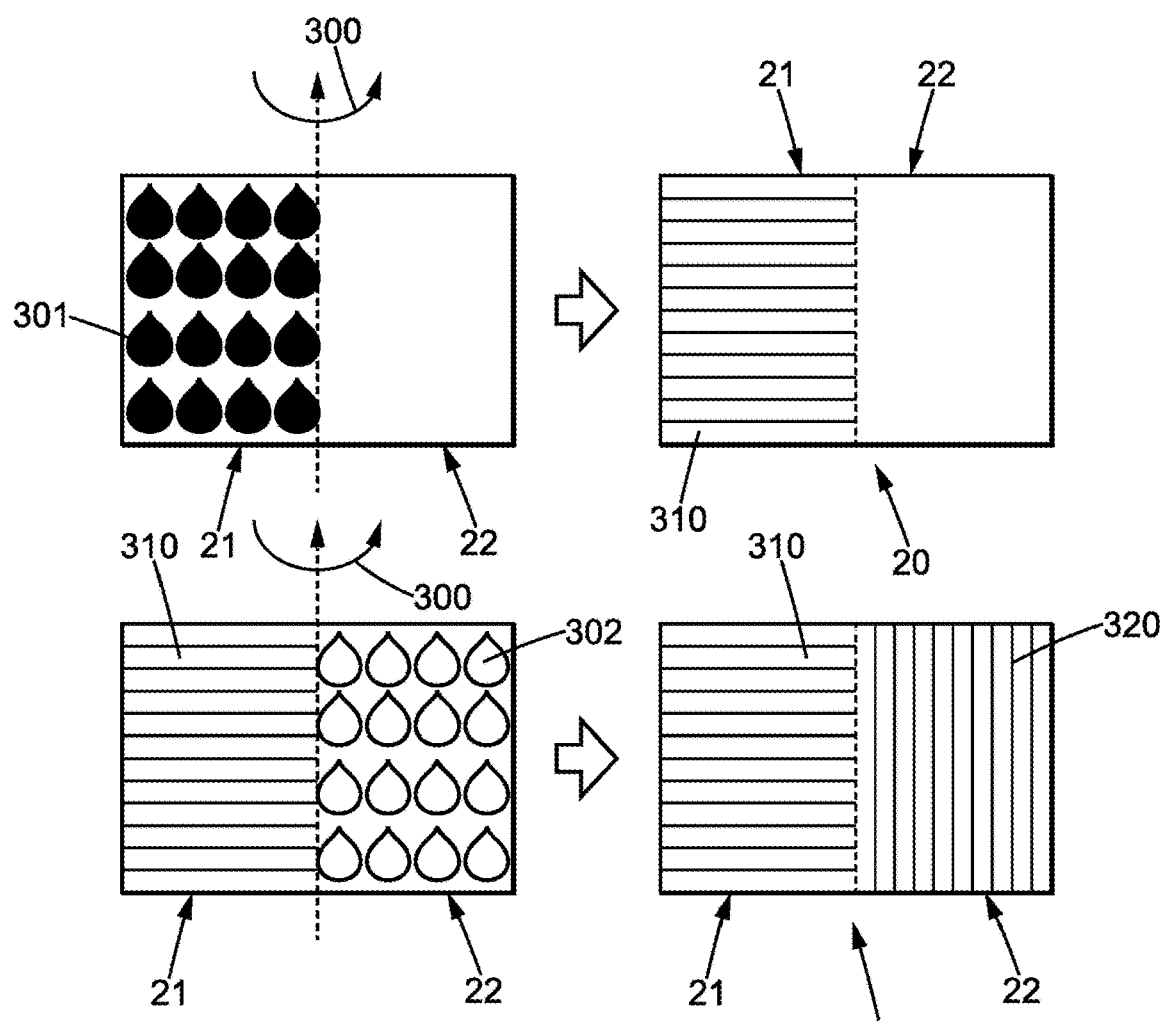
FIG. 3b is a schematic representation of a method for depositing two photoactive blends on an electrically conducting substrate according to a second embodiment.

FIGS. 3a and 3b display two embodiments for fabricating a multicolour optoelectronic device according to the invention.

In FIG. 3a, a first photoactive material 301 is deposited on a first portion 21 and a second photoactive material 302 is deposited on a second portion 22 of an electron extraction layer 20 of a solar cell. It is equally possible to deposit the photoactive material directly on an electrically conducting substrate 10, or to have the photoactive material deposited "indirectly" onto the electrically conducting substrate as in the example of FIGS. 3a and 3b.

The photoactive materials are blends in the examples of FIGS. 3a and 3b. These blends are liquid when deposited and can migrate across the electrically conducting substrate from opposite edges as illustrated on FIG. 3a, to meet at an area 23 where the first portion 21 contacts the second portion 22. In this area 23, the first photoactive material 301 mixes with the second photoactive material 302 to form a third photoactive material 303. Liquid blends can advantageously be miscible to promote this mixing so as to create a continuous and homogeneous electrical connection between the photoactive materials of the optoelectronic device. It is also possible to heat the photoactive materials prior to depositing them on the electrically conducting substrate to ease their migration or deposition as well as promoting a more homogeneous deposition and mixing. This heating step preferably brings both photoactive materials to a same temperature for optimal performances.

When the photoactive materials are in place, the substrate is spinned 300 to dry the photoactive material in order to form the photoactive layer 30. Other methods for drying the photoactive material, such as heat treatments, can be implemented.

In the example of FIG. 3a, both photoactive materials are deposited simultaneously and dried during the same spinning step.

In certain embodiments, it is advantageous to deposit each photoactive material in sequence as illustrated on FIG. 3b. Such situations occur for example when one of the photoactive materials requires a thermal treatment step after deposition (it is then advantageous to deposit this material first, dry it, heat treat it and then deposit the other photoactive material). Another situation which is suitable for a sequential deposition arises when the thicknesses of both photoactive layers are different.

The embodiment of FIG. 3b consists in depositing the first photoactive material 301 on the first portion 21 (for example by spin-coating, drop casting or ink jet printing), then drying this material by spinning 300 the substrate to form a first homogeneous layer 310. The second photoactive material 302 is later deposited and treated in the same way to obtain a second homogeneous layer 320, both layers being in contact and mixed in the area 23.

In other embodiments, it is possible to arrange the first photoactive material and the second photoactive material so that one at least partially overlaps the other. This may give rise to different electrical properties and produce a colour gradient in the optoelectronic device.

Figure 4A:
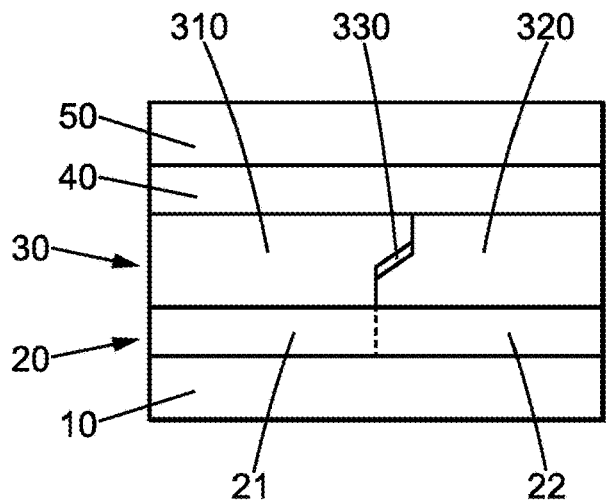
FIGS. 4a 4b and 4c are schematic representations of a multicolour optoelectronic device in the form of an organic solar cell seen from the side and from the top.
Figure 4B:
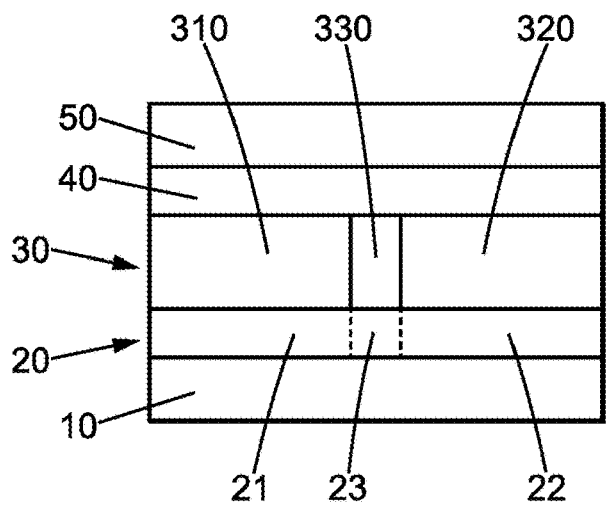
Figure 4C:
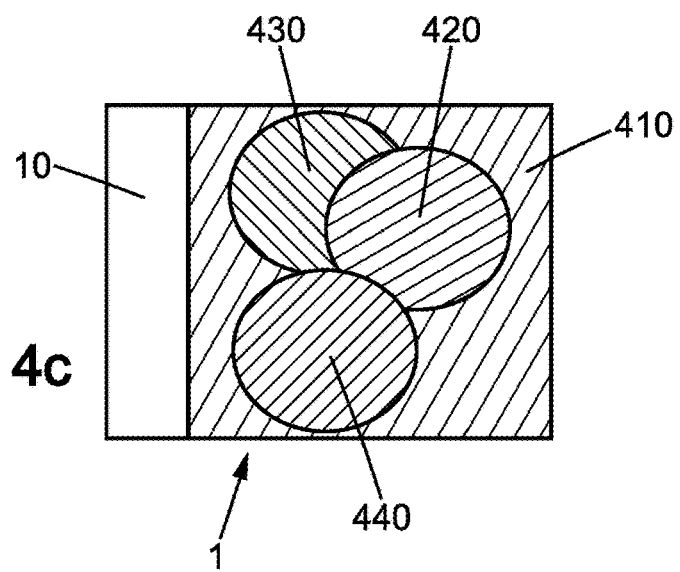

FIGS. 4a, 4b and 4c represent an example of an optoelectronic device produced by the method of the invention. FIG. 4a shows a side view of a solar cell comprising two different colours provided by two different photoactive materials. In the example of FIG. 4a, the first photoactive material at least partially overlaps the second photoactive material. In addition to such an overlap, an area may appear in which a both photoactive materials mix to form a third photoactive material. It is also possible that the first photoactive material 301 contacts the second photoactive material 302 without forming a third photoactive material at an area where both materials join.

In the example of FIG. 4b, both photoactive materials join in the area 23 to form a third homogeneous layer 330 that results from a mixture of the first photoactive material with the second photoactive material at the area 23.

FIG. 4c provides one illustration viewed from the top of a solar cell produced using the method of the invention. As illustrated on FIG. 4c, more than two photoactive materials can be present in the optoelectronic device 1. On FIG. 4c, first 410, second 420, third 430 and fourth 440 homogenous colour layers make up the photoactive layer of the optoelectronic device 1. The pattern according to which these colours are arranged can be controlled using an appropriate deposition technique.

Solar cells produced using the method of the invention comprise several photoactive materials in their active layers. As a result, the photo-electric properties of these cells can be adjusted in a range generally comprised within the values of photo-electric properties of each of the photoactive materials present in the cell. The photo-electric parameter of a composite solar cell such as the one presented in this invention mostly depends on the relative amount of each photoactive material in the cell. This amount can typically be controlled by adapting the sizes of each portion on which the photoactive materials are deposited.

Figure 5A:
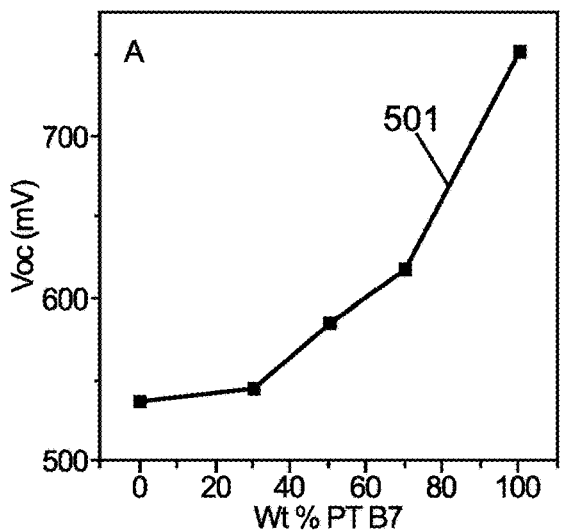
FIGS. 5a-5c are graphs representing the evolution of three photo-electric properties (open voltage, Voc, photocurrent density Jsc and conversion efficiency PCE) in a multicolour solar cell according to the invention as a function of the ratio between two materials used in the photoactive layer.
Figure 5B:
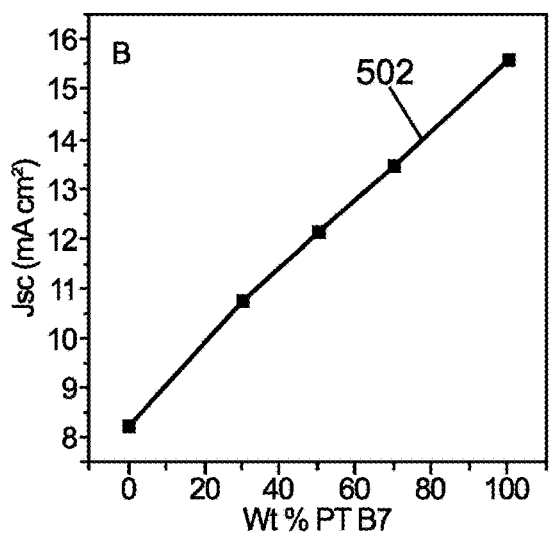
Figure 5C:
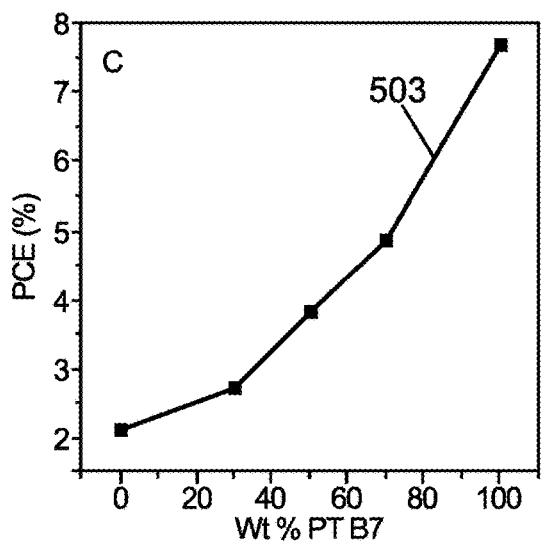

FIGS. 5a, 5b, 5c are graphs representing the evolution of three photo-electric parameters in a solar cell made of two photoelectric materials, as a function of the ratio between both photoelectric materials (expressed as a percentage of the total surface occupied by one of the photoactive materials).

FIG. 5a represents the evolution of the open voltage in such a solar cell. FIG. 5b represents the evolution of the photocurrent density in such a solar cell. FIG. 5c represents the evolution of the conversion efficiency in such a solar cell. It is to be noted that the evolution of the photocurrent density with the ratio between both photoelectric materials is linear, which makes it possible to conceive a solar cell having a desired photocurrent density when this desired value lies in a range comprised between the photocurrent densities of both photoactive materials. A similar selection of a value for a photo-electric parameter in a composite solar cell can be made based on the knowledge of the dependence of this parameter with the amount of each photoactive material.

To further tune the photo-electric properties of a multicolour optoelectronic device, it is possible to include additives in the photoelectric materials, such as for example to add a ferroelectric material to increase the open voltage of the device.

Not only does the method of the invention simplify the fabrication of multicolour optoelectronic devices, but it also makes it more simple to assemble these devices into an array or a panel.

Figure 6A:
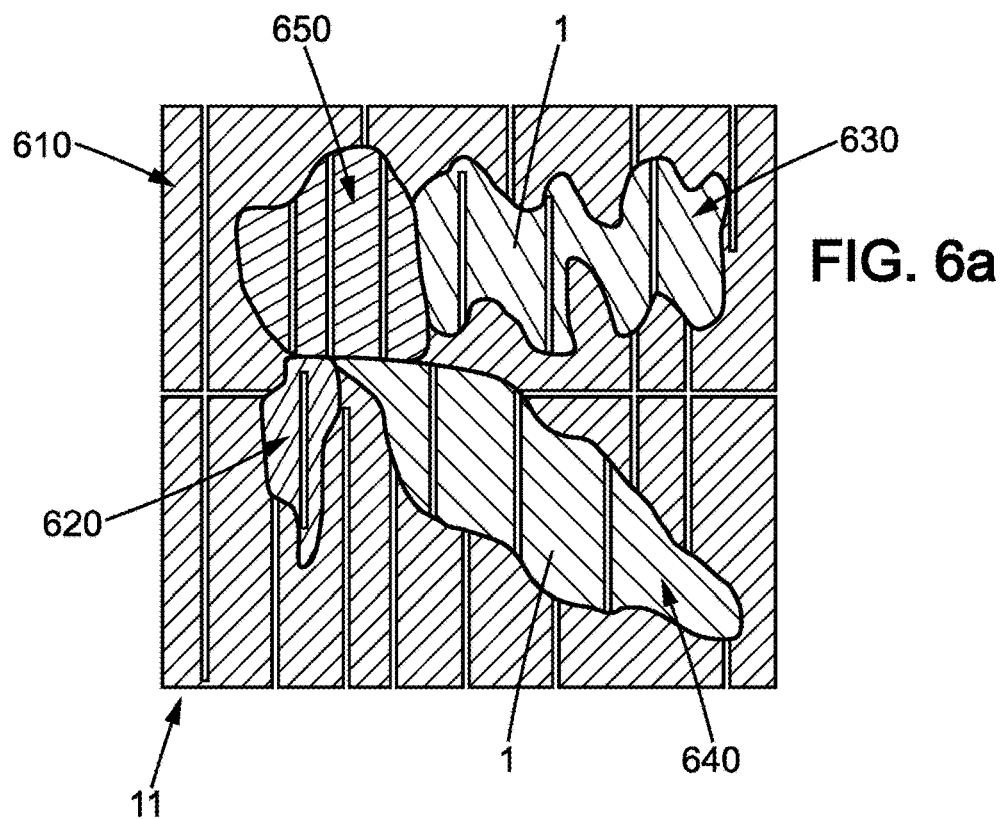
FIG. 6a is a schematic representation of a solar panel viewed from the top and fabricated using prior art methods in which each solar cell is made of a single colour and has particular shapes to suit a desired pattern.

FIG. 6a shows a multicolour solar panel produced using prior art techniques. This solar panel 11 is made of cells which each have only one photoactive material in their photoactive layer. Because of this, cells 1 need to have specific shapes, and must be connected electrically in series only to cells of the same colour to avoid the appearance of undue electrical resistance across the panel. On FIG. 6a, a first 610, second 620, third 630, fourth 640 and fifth 650 type of cell is represented, each type being associated to a specific colour.

Figure 6B:
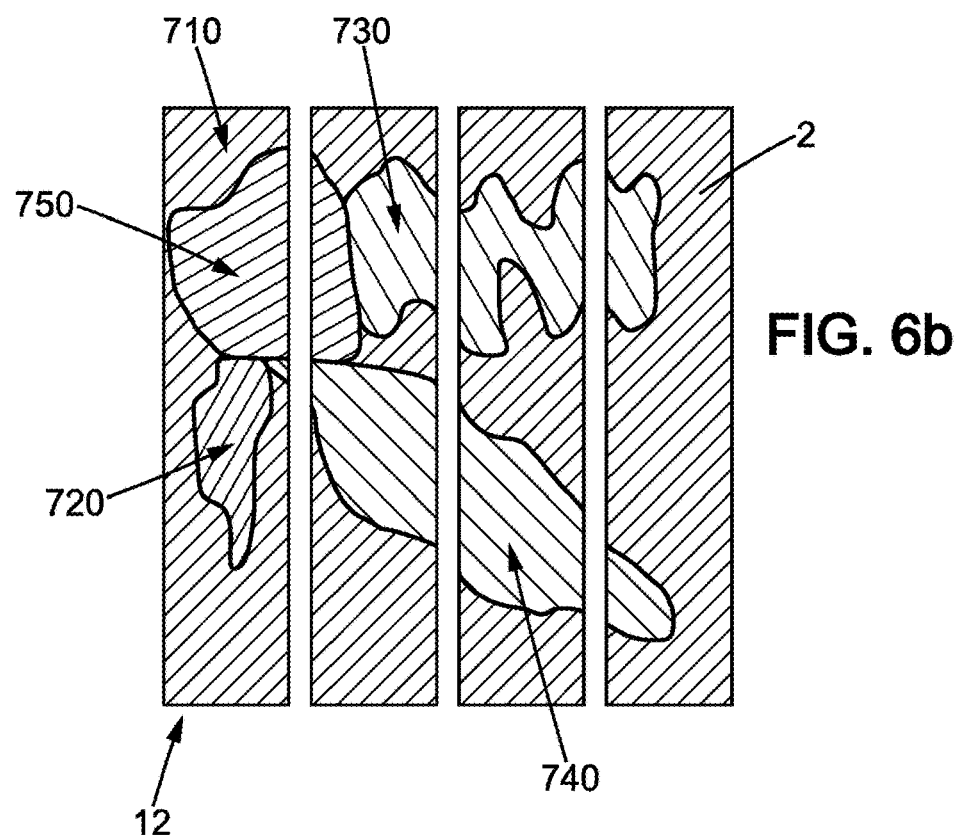
FIG. 6b is a schematic representation of a solar panel viewed from the top and fabricated using the method of the invention.

Using the method of the invention, it becomes much easier to fabricate a solar panel or light emitting diode array that has a desired colour pattern as illustrated on FIG. 6b. Each cell 2 of the panel 12 can comprise several photoactive materials and the cells can be connected in series regardless of the composition of their photoactive layers. On FIG. 6b, the panel 12 comprises a first 610, second 620, third 630, fourth 640 and fifth 650 type of photoactive material, these types being associated to a specific colour.

The invention is not limited to photovoltaic applications. As mentioned above, the method can be used to fabricate different sorts of optoelectronic devices such as light emitting diodes, light emitting diode arrays, nanocrystals or quantum dot based devices, hybrid light emitting or light absorbing devices.

The invention claimed is:

1. A method for producing a multicolored optoelectronic device, the method comprising:
    obtaining an electrically-conducting substrate comprising at least a first portion and a second portion adjacent to the first portion;
    depositing a first photoactive material having optical properties in a first frequency range on the first portion; and
    depositing a second photoactive material differing from the first photoactive material and having optical properties in a second frequency range on the second portion, the first photoactive material contacting the second photoactive material, the first photoactive material and second photoactive material forming a photoactive layer of the multicolored optoelectronic device,
    wherein the multicolored optoelectronic device is one of: a solar cell, a photovoltaic panel comprising cells, a perovskite-based solar cell, and a quantum dot-based hybrid solar cell, and
    wherein the first photoactive material and the second photoactive material are deposited so that the shape of each cell is independent from an arrangement of the first and second photoactive materials on the electrically-conducting substrate.

2. The method according to claim 1, further comprising:
    associating the first photoactive material with the second photoactive material in an area where the first portion contacts the second portion to form a mixed photoactive material in said area.

3. The method according to claim 1, further comprising:
    determining respective sizes of the first portion and the second portion so that a ratio between an amount of first photoactive material and an amount of second photoactive material gives rise to a photoactive layer having a predetermined value for a photo-electrical parameter in a range between a value of said photo-electrical parameter in the first photoactive material and a value of said photo-electrical parameter in the second photoactive material.

4. The method according to claim 3, wherein the photo-electrical parameter of the photoactive layer is one of: open voltage, short-circuit current density, light-electricity conversion efficiency, and electricity-light conversion efficiency.

5. The method according to claim 1, wherein the first photoactive material and the second photoactive material are deposited using a technique from one of: drop casting, doctor blading, spin coating, ink jet printing, and spray coating.

6. The method according to claim 1, further comprising:
depositing the first photoactive material on the first portion to form a first homogeneous layer;
depositing the second photoactive material on the second portion to form a second homogenous layer in contact with the first homogeneous layer; and
drying the first homogenous layer and the second homogenous layer.

7. The method according claim 1, further comprising:
depositing the first photoactive material on the first portion to form a first homogeneous layer;
drying the first homogeneous layer;
depositing the second photoactive material on the second portion to form a second homogenous layer in contact with the first homogeneous layer; and
drying the second homogenous layer.

8. The method according to claim 1, further comprising:
selecting one or more of a composition and a viscosity of the first photoactive material and the second photoactive material to obtain a desired thickness and desired optical properties for the photoactive layer.

9. A multicolored optoelectronic device comprising:
an electrically-conducting substrate comprising at least a first portion and a second portion adjacent to the first portion; and
a photoactive layer on the electrically-conducting substrate, the photoactive layer comprising a first photoactive material having optical properties in a first frequency range on the first portion and a second photoactive material differing from the first photoactive material and having optical properties in a second frequency range on the second portion, the first photoactive material contacting the second photoactive material,
wherein the multicolored optoelectronic device is one of: a solar cell, a photovoltaic panel comprising cells, a perovskite-based solar cell, and a quantum dot-based hybrid solar cell, and
the shape of each cell is independent from an arrangement of the first and second photoactive materials on the electrically-conducting substrate.

10. The multicolored optoelectronic device according to claim 9, wherein the photoactive layer further comprises an area above a contact between the first portion and the second portion comprising a photoactive material resulting from a mixture of the first photoactive material with the second photoactive material.

11. The multicolored optoelectronic device according to claim 9, wherein the first photoactive material at least partially overlaps the second photoactive material.

12. The multicolored optoelectronic device according to claim 9, wherein the photoactive layer further comprises at least one ferroelectric material.

13. The multicolored optoelectronic device according to claim 9, wherein the multicolored optoelectronic device is one of: a light emitting diode, a light emitting diode array, a perovskite-based light-emitting diode, and an organic light-emitting diode.

14. The multicolored optoelectronic device according to claim 9, further comprising a transparent electrically-conducting substrate.

* * * * *